United States Patent
Tang et al.

(10) Patent No.: US 10,483,847 B2
(45) Date of Patent: Nov. 19, 2019

(54) POWER CONVERTER CALIBRATION METHOD AND APPARATUS

(71) Applicant: Infineon Technologies Austria AG, Villach (AT)

(72) Inventors: Benjamim Tang, Rancho Palos Verdes, CA (US); Chun-Yen Lin, Zhongli (TW); Rohan Samsi, Redondo Beach, CA (US); Jinghong Guo, Torrance, CA (US); Tim M. Ng, Monterey Park, CA (US); Richard C. Pierson, Newport Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 346 days.

(21) Appl. No.: 14/601,401

(22) Filed: Jan. 21, 2015

(65) Prior Publication Data

US 2015/0162827 A1    Jun. 11, 2015
US 2016/0181916 A9    Jun. 23, 2016

Related U.S. Application Data

(62) Division of application No. 13/042,914, filed on Mar. 8, 2011, now Pat. No. 8,972,216.

(60) Provisional application No. 61/312,163, filed on Mar. 9, 2010.

(51) Int. Cl.
| | |
|---|---|
| H02M 3/156 | (2006.01) |
| G01R 19/00 | (2006.01) |
| G01R 35/00 | (2006.01) |
| H01L 27/02 | (2006.01) |
| G01R 31/40 | (2014.01) |
| H02M 3/158 | (2006.01) |
| H02M 1/00 | (2006.01) |
| B23K 26/351 | (2014.01) |

(52) U.S. Cl.
CPC ............ *H02M 3/156* (2013.01); *G01R 19/00* (2013.01); *G01R 35/005* (2013.01); *B23K 26/351* (2015.10); *G01R 31/40* (2013.01); *H01L 27/0211* (2013.01); *H02M 3/1584* (2013.01); *H02M 2001/0009* (2013.01)

(58) Field of Classification Search
CPC .............. H02M 3/156; H02M 3/1584; H02M 2001/0009; G01R 31/40; G01R 19/00; G01R 35/005; H01L 27/0211; B23K 26/0003; B23K 26/351
See application file for complete search history.

(56) References Cited

U.S. PATENT DOCUMENTS

| | | |
|---|---|---|
| 4,284,872 A | 8/1981 | Graeme |
| 4,949,029 A * | 8/1990 | Cooper .................. G01R 35/04 324/130 |
| 5,628,199 A | 5/1997 | Hoglund et al. |
| 6,628,106 B1 | 9/2003 | Batarseh |

(Continued)

*Primary Examiner* — John E Breene
*Assistant Examiner* — Eyob Hagos
(74) *Attorney, Agent, or Firm* — Murphy, Bilak & Homiller, PLLC (57) ABSTRACT

Methods and apparatus for a power regulator according to various aspects of the present invention may comprise a sensor adapted to generate a measurement of a voltage or a current. A memory may store a correction parameter that corresponds to the measurement, and a correction system may be adapted to adjust the measurement according to the correction parameter.

19 Claims, 5 Drawing Sheets

(56) References Cited

U.S. PATENT DOCUMENTS

| | | | |
|---|---|---|---|
| 7,061,253 B2 * | 6/2006 | Coffeen | G01R 31/1245 324/551 |
| 7,193,864 B2 | 3/2007 | Hansson | |
| 7,403,400 B2 | 7/2008 | Stanley | |
| 7,504,807 B2 | 3/2009 | Kataoka | |
| 7,511,437 B2 | 3/2009 | Lys et al. | |
| 7,825,642 B1 * | 11/2010 | Young | H02M 3/157 323/224 |
| 8,154,262 B2 | 4/2012 | Kanayama | |
| 8,232,786 B2 | 7/2012 | Phadke et al. | |
| 8,339,102 B2 | 12/2012 | Kushnarenko et al. | |
| 2001/0036322 A1 | 11/2001 | Bloomfield et al. | |
| 2005/0024035 A1 | 2/2005 | Tabaian et al. | |
| 2005/0174709 A1 | 8/2005 | Kushnarenko | |
| 2006/0186867 A1 | 8/2006 | Kataoka | |
| 2006/0261057 A1 * | 11/2006 | Horvath | H05B 3/342 219/529 |
| 2007/0025124 A1 | 2/2007 | Hansson et al. | |
| 2007/0188114 A1 | 8/2007 | Lys et al. | |
| 2007/0257650 A1 * | 11/2007 | Southwell | H02M 3/1584 323/283 |
| 2008/0061883 A1 | 3/2008 | Kataria | |
| 2008/0316779 A1 | 12/2008 | Jayaraman et al. | |
| 2009/0198460 A1 * | 8/2009 | Carroll | G01R 19/2513 702/60 |
| 2010/0020579 A1 | 1/2010 | Melanson | |
| 2012/0062249 A1 | 3/2012 | Shamir | |

* cited by examiner

POWER CONVERTER CALIBRATION METHOD AND APPARATUS

CROSS-REFERENCES TO RELATED APPLICATIONS

This application is a Divisional of U.S. patent application Ser. No. 13/042,914, filed Mar. 8, 2011, which in turn claims the benefit of U.S. Provisional Patent Application No. 61/312,163, filed Mar. 9, 2010, both of said applications incorporated herein by reference in their entirety.

BACKGROUND

Regulated power supplies typically supply voltage and current to electrical systems, such as microelectronic devices. The regulated power supply delivers power from a primary source to an electrical load at the specified current, voltage, and power efficiency. Many systems use switching power converters (SPCs) due to their high efficiency, high current capability, and topology flexibility. In addition, SPCs can be designed to provide the very precise voltage and current characteristics required by devices such as microprocessors, microcontrollers, memory devices, and the like.

Power requirements for various applications, such as emerging leading edge technology microprocessors, have become very difficult to satisfy. As the speed and integration of microprocessors increases, the demands on the power regulation system increase. In particular, as gate counts increase, the power regulation current demand increases, the operating voltage decreases, and transient events (e.g., relatively large voltage spikes or droops at the load) typically increase in both magnitude and frequency. Some emerging microprocessors are expected to run on less than 1.3 volts and more than 100 amperes.

SPC's utilizing step-down multi-phase buck converters have been the preferred topology to meet the low voltage and high current requirements of microprocessors. With the advent of increasingly complex power regulation topologies, digital techniques for power converter control, specifically in multiphase designs, can improve precision and reduce the system's total parts count while also supporting multiple applications in the same power system through digitally programmable feedback control.

Existing feedback controls have taken voltage measurements from the load, as well as from the individual output phases. The feedback information has been used to adjust the width of the pulses produced by each of the phases of a multi-phase buck regulator system to bring the supplied voltage and current within the load line tolerances specified by the microprocessor manufacturer. Active Transient Response (ATR) has been used for high frequency response to rapidly changing power requirements at the load by quickly activating multiple phases to supply or drain (as the case requires) more current to or from the load, thereby temporarily overriding the generally slower overall voltage regulator system response.

The measurement of load current is important for meeting microprocessor power requirements that specify a load line and active voltage positioning by defining narrow parameters within which current must be supplied at a specified voltage. In addition, leading edge microprocessors may specify current levels that must not be exceeded to avoid damage. To measure current, conventional systems use trimmed current sense circuitry and tight component tolerance to enhance accuracy. The solution offers limited accuracy, however, because the inherent errors accumulate over multiple sources and are not completely accounted for.

SUMMARY

Methods and apparatus for a power regulator according to various aspects of the present invention may comprise a sensor adapted to generate a measurement of a voltage or a current. A memory may store a correction parameter that corresponds to the measurement, and a correction system may be adapted to adjust the measurement according to the correction parameter.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION

The present invention may be described in terms of functional block components and various processing steps. Such functional blocks may be realized by any number of hardware or software components configured to perform the specified functions and achieve the various results. For example, the present invention may employ various resistors, transistors, capacitors, inductors, digital logic circuits, driver circuits, voltage supplies, measurement sensors, and the like, which may carry out a variety of functions. In addition, the present invention may be practiced in conjunction with any number of circuits and systems, and the power regulator described is merely one exemplary application for the invention. Further, the present invention may employ any number of techniques for digital calibration, generating voltages, measuring currents, generating signals, and the like, such as disclosed in U.S. Pat. No. 7,262,628 to Southwell et al.

Various representative implementations of the present invention may be implemented in conjunction with a power regulator and a test system. The power regulator may comprise any suitable converter for supplying power to a load, such as a converter using step-down, step-up, buck, boost, buck-boost, forward, flyback, half-bridge, full-bridge, and/or SEPIC topologies.

Figure 1:
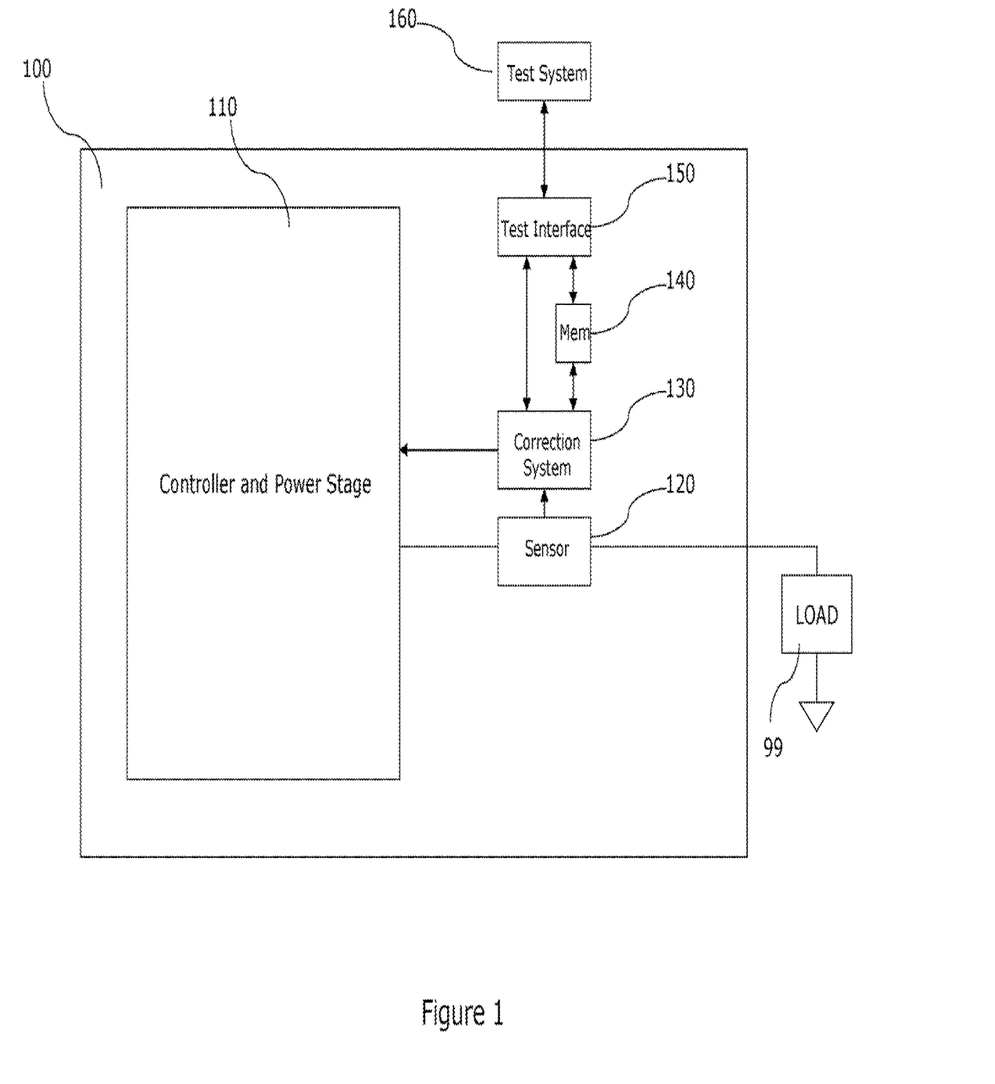
FIG. 1 is a block diagram of a test system coupled to a voltage regulator.

Referring to FIG. 1, in one embodiment, the power regulator 100 may comprise a controller with a power stage 110, a sensor 120 adapted to measure a voltage or a current, a correction system 130 adapted to adjust the measured voltage or current by a correction parameter, and a memory 140 adapted to store a correction parameter. The power regulator 100 may further comprise a test interface 150 that is configured to interface with a test system 160 and write the correction parameter to the memory 140.

Figure 2:
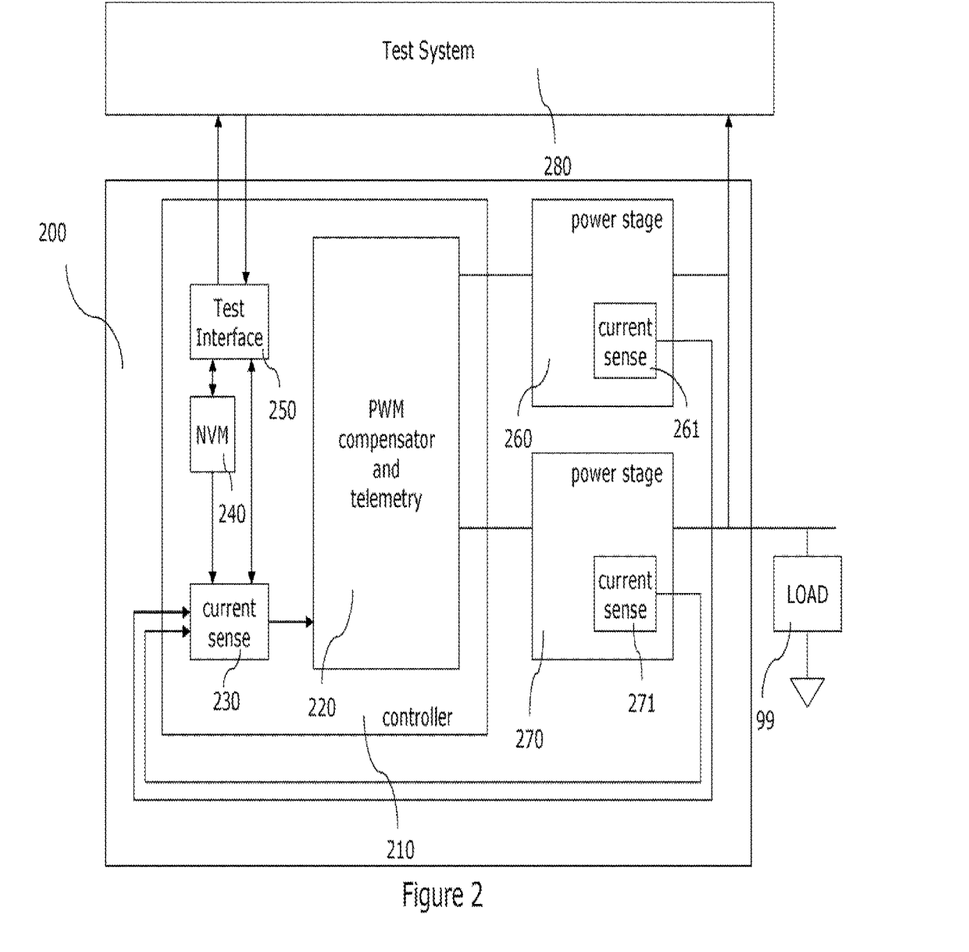
FIG. 2 is block diagram of a test system coupled to a voltage regulator.

For example, referring to FIG. 2, the power regulator may comprise a multiphase power regulator 200, such as a buck converter configured to step down a first DC voltage to a lower DC voltage, configured to operate in conjunction with a test system 280. The multiphase power regulator 200 may generate a switching waveform or square wave that is filtered to provide a relatively smooth output. In one embodiment, the power regulator 200 comprises a multiphase controller 210 and one or more power stages 260, 270. Feedback signals allow the output voltage to be regulated by controlling the duty cycle of the waveform. Because the power stage is fully switched (i.e., the power stages 260, 270 are fully off or on), there is little loss in the power stage and the converter efficiency is high. While the exemplary embodiment is discussed in conjunction with a buck converter, various aspects of the present invention may be practiced in conjunction with other suitable power regulators, including switching regulator topologies.

The controller 210 and power stages 260, 270 may be implemented in any appropriate manner, such as one or more ICs, as discrete components, as a single integrated unit, or the like. The multiphase power regulator 200 may comprise a DC-DC converter to provide power to a DC load 99 comprising one or more circuits, such as a microprocessor or other load, and may comprise any appropriate systems and components to provide power to the load 99 and perform calibration.

The power stages 260, 270 control the power supplied to the load 99 according to signals from the controller 210. The power stages 260, 270 may form a set of phases, and each phase may be controlled to supply power to the load 99. For example, the power stages 260, 270 may comprise switches connected to a power source and a sink (such as ground), and the switches may be switched on and off to alternately connect the load to the power source and the sink or place the power stage in a high impedance state. The power stages 260, 270 may comprise any appropriate power stages, such as conventional MOSFET-based driver circuits for a power regulator, including power MOSFETs, synchronous MOSFETs, output inductors, and/or output capacitors.

In one embodiment, the power regulator 200 comprises one or more current sensors 261, 271 to configured to provide the controller 210 with an output current. The current sensors 261, 271 may be adapted to measure the output current of each power stage 260, 270 and to generate an output current signal corresponding to the measured output current. The output current signal may be provided to the controller 210 as feedback.

The current sensors 261, 271 may be implemented in any suitable manner to measure current, and may comprise any appropriate components, such as conventional active or passive current sensor circuits. For example, in one embodiment, the current sensors 261, 271 comprise conventional current sensors configured to sense the output current through the voltage across an output inductor (e.g., DCR current sense), voltage across a transistor in the power stage 260, 270 (e.g., RDSon), a current mirror of one or more transistors in power stage 260, 270 (e.g., current mirror), or voltage across a resistor in series with the input, output, or ground return (e.g., shunt resistor). The current sensors 261, 271 may further comprise additional circuitry to provide gain, offset, clamping, filtering, or other processing that generates a measured current signal to the controller that corresponds to the measured current.

In one embodiment, the controller 210 is configured to control the output of the power stages 260, 270 to regulate an output voltage supplied to the load 99. The controller 210 may control the power stages 260, 270 in any suitable manner, such as according to conventional pulse width modulation techniques, pulse frequency modulation techniques, or other suitable control processes. The controller 210 may comprise analog components, digital components, or a combination of analog and digital components. The controller 210 may operate in response to any suitable inputs and parameters, such as reference signals, current feedback, voltage feedback, target output voltage and/or current.

In one embodiment, the controller 210 is configured to receive a measured current signal from the power stages 260, 270. In one embodiment, the controller 210 is configured to modify its response according to the output current. In one embodiment, the controller 210 modifies the measured current signal according to a correction parameter in order to account for an inaccuracy in the measured current signal.

In one embodiment, the controller 210 comprises a pulse width modulator (PWM) circuit 220 configured to generate pulse width modulated signals that control a duty cycle of the power stages 260, 270 such that the DC-DC voltage conversion meets the target output voltage. The controller 210 may respond to feedback signals, such as feedback signals corresponding to output current and/or output voltage, load lines, transient control, adaptive voltage positioning, and the like. For example, in many DC-DC converters, the output current may be determined with precision, so that the converter can perform functions such as current monitoring, telemetry, limiting, and adaptive voltage positioning (load line or droop resistance).

In one embodiment, the controller 210 operates in one or more modes. For example, the controller 210 may be configured to operate in various modes of operation comprising a mode with a variable number of phases, different modes to optimize transient response or efficiency, special test modes such as reduced or single phase operation, or reduced bandwidth modes to isolate measurements to a subset of the sense elements and circuitry and filter measurement noise.

The controller 210 may include any appropriate elements for controlling the power to the load 99 via the power stages 260, 270 and interfacing with the test system 180 for calibration. In one embodiment, the controller 210 comprises the pulse width modulation (PWM) circuit 220, a current sense circuit 230, a non-volatile memory (NVM) 240, and a test interface 250. In one embodiment, the PWM circuit 220 drives the power stages 260, 270, according to, among other things, signals received from the current sense circuit 230, which may receive the measured current signals from current sensors and generate signals accordingly.

In one embodiment, the PWM circuit 220 provides a duty cycle that drives the power stages 260, 270. The PWM circuit may comprise any suitable system or circuit for driving the power stages 260, 270, such as a conventional PWM controller for digital power regulator controllers. The PWM circuit 220 may drive the power stages according to any suitable criteria and inputs, such as a voltage and a current feedback signal, load lines, transient control, adaptive voltage positioning, and the like. The PWM circuit 220 may also perform other functions, such as correction and telemetry functions. In the present embodiment, the PWM circuit controls the signals of the power stages 260, 270 according to the current feedback signal, for example received via the current sense circuit 230, and output voltage feedback (not shown).

Current and voltage feedback signals may be provided to the PWM circuit 220 and/or other elements of the controller 210 in any suitable manner. In one embodiment, the correction system 130 is adapted to adjust measured current and voltage measurements and provide the adjusted signals to the PWM circuit 220. In one embodiment, the correction system 130 is adapted to retrieve a stored correction parameter from a memory. The correction system may be independently implemented, integrated into the controller 210, a sensor, the current sense circuit 230, or any other suitable element or location.

In one embodiment, the current sense circuit 230 receives the measured current signals from the current sensors 261, 271 and transmits the current feedback signal to the PWM circuit 220 and/or other elements of the controller 210. The current sense circuit 230 may generate an analog or digital representation of the current based upon the measured current signals received from the current sensors 261, 271. In one embodiment, the current sense circuit 230 receives output current measurements from the current sensors 261, 271 in the power stages 260, 270, and transmits raw or adjusted output current measurement to other systems, such as the test interface 250 and the PWM circuit 220.

In addition, in one embodiment, the current sense circuit 230 is coupled to the NVM 240, for example to read correction parameters from the NVM 240. In one embodiment, the current sense circuit 230 may perform one or more functions of the correction system 130, such as adjusting the measured current according to the correction parameters, and the adjusted current measurement may be provided to the various systems, such as the PWM circuit 220 and/or the test interface 250. Alternatively, in one embodiment, the current sense circuit 230 transfers raw output current signals to the PWM circuit 220, such as by multiplexing the signals from the current sensors 261, 271. The PWM circuit 220 or other system may perform one or more functions of the correction system 130, such as retrieving the correction parameters from the NVM 240 and adjusting the measured current output accordingly.

The controller 210 may include a memory configured to the store correction parameters to be used by the controller 210 to compensate for errors or variations that affect the measured output current, such as errors associated with the current sensors 261, 271, the controller 210, or the load 99. The memory may be accessed by any appropriate systems, such as the test interface 250, the PWM circuit 220, and the current sense circuit 230. The memory may also store other data in addition to the correction parameters. The memory may comprise any appropriate memory element for storing data. In the present embodiment, the memory comprises the NVM 240. The NVM 240 may comprise a memory that retains stored information even when not powered.

The test interface 250 provides an interface between the test system 280 and the regulator 200. The test interface 250 may facilitate implementing test processes, monitoring the operation of the regulator 200 in response to the test processes, reading the sensed current output from the current sense circuit 230, and/or reading and storing correction parameters in the NVM 240. The test interface 250 also may allow the test system 280 to control the mode of operation of the multiphase power regulator 200 as well as the current provided by the multiphase power regulator 200 to the load 99.

The test system 280 tests the regulator 200, for example to test and/or to adjust the operation of the regulator 200. The test system 280 may comprise any appropriate system for testing the regulator, such as a computer programmed to at least partially control the operation of the regulator 200 and measure the output and/or other performance characteristics of the regulator 200. For example, referring to FIG. 3, the test system 280 may comprise a regulator interface 288 to transmit signals to and from the regulator 200. The test system 280 may further comprise a test controller 282, a monitoring system 284, and a calculation system 286. The test controller 282 generates test signals to be applied to the regulator 200, for example to control the operation of the regulator 200. The monitoring system 284 monitors the operation of the regulator 200, such as by monitoring the output and other signals of the regulator 200 in response to the test signals applied by the test controller 282. The calculation system 286 calculates correction parameters to compensate for errors associated with the regulator 200.

Figure 3:
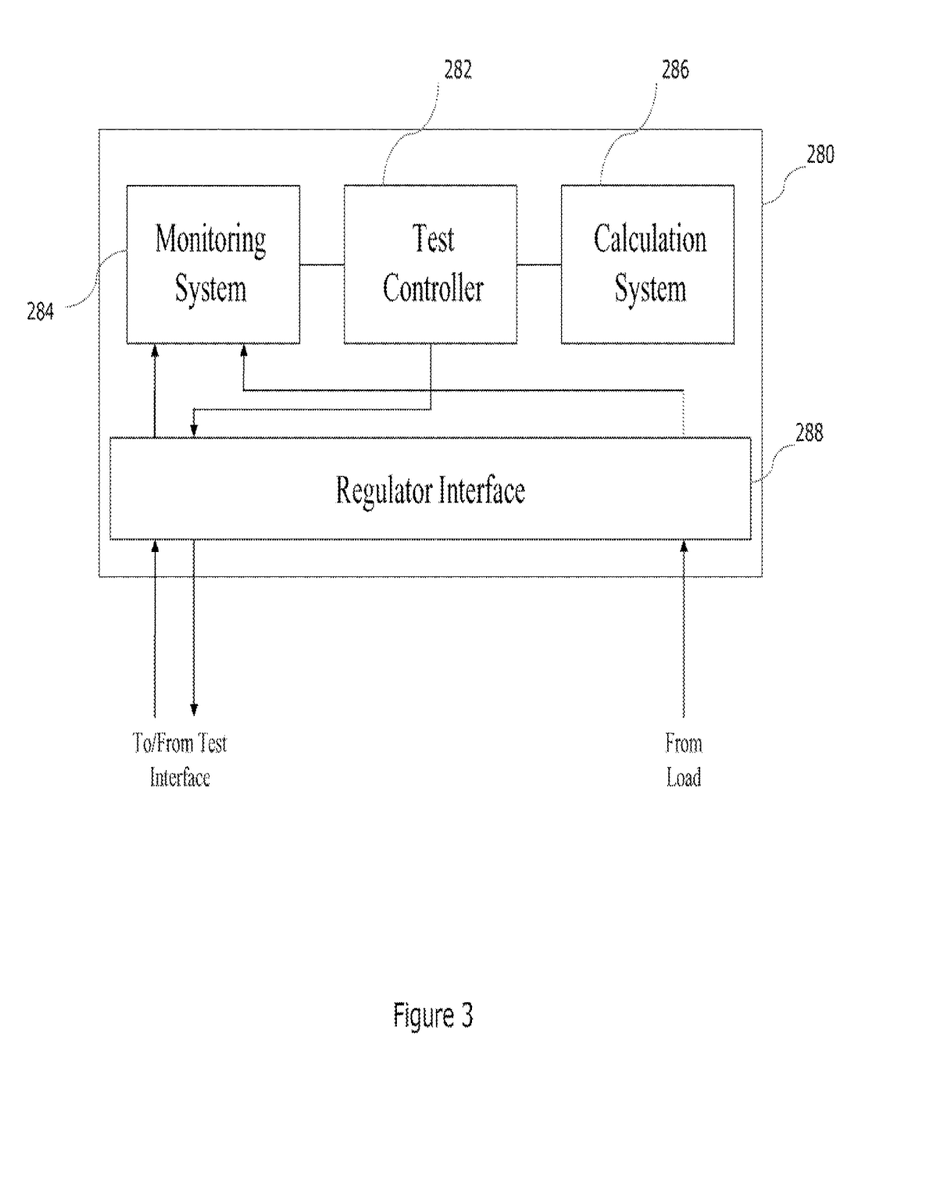
FIG. 3 is a block diagram of a test system.

The test controller 282, monitoring system 284, and calculation system 286 may be implemented as multiple systems or integrated into a single system. For example, the test controller 282, monitoring system 284, and calculation system 286 may be implemented via a single computer programmed to apply test signals to the regulator 200, measure and process the response of the regulator 200, and compute correction parameters for detected errors in the regulator 200. Alternatively, one or more of the various systems of the test system 280 may be integrated with other systems or separated into multiple discrete devices. In one embodiment, the test system 280 may take current measurements in multiple modes of operation, determine the accuracy of the output current measurements made by the multiphase power regulator 200 in each mode of operation, and provide the controller 210 with correction parameters, such as for each mode of operation. The correction parameters may be stored in the NVM 240 and used by the regulator 200 to more accurately measure and/or control the multiphase power regulator's 200 output.

The regulator interface 288 facilitates transmission of signals between the test system 280 and the regulator 200. The regulator interface 288 may comprise any suitable interface, for example comprising physical and electrical connections for connecting the test system 280 to the regulator 200. In the present embodiment, the regulator interface 288 is adapted to connect to the output of the regulator 200, for example to measure the voltage and/or current output to the load, and to the test interface 250 of the controller 210. The regulator interface may, however, provide any appropriate connections for controlling the regulator 200 and/or monitoring the response of the regulator 200.

The monitoring system 284 may receive information from the regulator 200 for testing. For example, the monitoring system 284 may comprise a memory, such as one or more registers, buffers, random access memory, or the like, coupled via the regulator interface 288 to the regulator 200, such as at the output of the power stages 260, 270 and the output of the current sense circuit 230. The monitoring system 284 may accurately measure the current supplied to the load 99 by the power stages 260, 270, as well as the output current measured by the multiphase power regulator 200, such as at the current sense circuit 230 and/or the current sensors 261, 271. The monitoring system may, however, measure or receive any appropriate signals corresponding to the regulator 200 operation.

In the present embodiment, the monitoring system 284 measures the voltage and/or current provided to the load 99, such as via a connection to the output of the power stages 260, 270. The monitoring system 284 is also connected to the test interface 250 of the controller 210. Through the test interface 250, the monitoring system 284 may measure the output current as measured by the regulator 200 elements and indicated by the current sense circuit 230. The monitoring system 284 may measure any suitable parameters, such as the output current of the multiphase power regulator 200 and the output current measured by the current sensors 261, 271 and/or the current sense circuit 230.

The test controller 282 operates the regulator 200 and/or supplies test signals to the regulator 200 to test the operation of the regulator 200 and allow the monitoring system 284 to gather information. The test controller 282 may comprise any suitable system for controlling the regulator 200 and generating the proper test signals, and may control the regulator 200 according to any appropriate test procedure or generate any suitable test signals. For example, the test controller 282 may comprise a computer programmed to generate test signals according to a test program to cause the regulator 200 to operate under certain desired conditions.

In the present embodiment, the test controller 282 may control the output and/or mode of the multiphase power regulator 200. For example, the test controller 182 may induce the multiphase power regulator 200 to output a specific voltage and/or a specific current or generate specific PWM signals. The test controller 282 may also be adapted to generate an operating mode signal to place the multiphase power regulator 200 in one or more different modes of operation. For example, the multiphase power regulator 200 may be placed in a mode with a variable number of phases, different modes to optimize transient response or efficiency, special test modes such as reduced or single phase operation, and/or reduced bandwidth modes, such as to isolate the measurement to a subset of the sense elements and circuitry and filter measurement noise. In each mode, the monitoring system 284 may record various measurements and signals, and transfer the results to the calculation system 286.

The calculation system 286 calculates correction parameters to correct for errors in the regulator 200, such as according to the measurements made by the monitoring system 284 in response to test procedures implemented by the test controller 282. The correction parameters may be provided to the controller 210, which can use the correction parameters to compensate for errors in the regulator 100, such as to modify current sense data to achieve a more accurate measurement.

The calculation system 286 may calculate the correction parameters according to any suitable criteria and/or algorithms. For example, if the monitoring system 284 of the test system 280 measures the output current of the multiphase power regulator 100 to be 10 amps and the multiphase power regulator 100 measures the output current to be 10.1 amps, the calculation system 286 may provide a correction parameter that is a linear offset of −0.1 amps. In another embodiment, the correction parameter may be a gain, such that in the above example, the correction parameter may comprise a gain factor of 1.01. In other embodiments, the correction parameter could be both a gain and an offset, or a look-up table of correction parameters for correcting measurements under different conditions. Any appropriate algorithm may be utilized for generating and using the correction parameters. The test system 180 may take multiple measurements under multiple conditions, and the calculation system 186 may create one or more correction parameters accordingly.

The calculation system 286 may store the correction parameters such that the correction parameters are accessible to the regulator 200, such as in the NVM 240. During operation, the regulator 200 may access the NVM 240 to retrieve the correction parameters to compensate for measurement errors.

The test system 280 may test the accuracy of the multiphase power regulator 200 and generate correction parameters based on the tests. The test system 280 may test the regulator 200 according to any suitable test procedure to identify characteristics of the regulator 200, such as to identify errors in measurements from the current sensors 261, 271, current sense circuit 230, or other elements. In various embodiments, the test system 280 may make several measurements to determine the current sense accuracy. The test system 280 may generate correction parameters and interface with the controller 210 to store the correction parameters in the NVM 240. The correction parameters may be calculated and applied to minimize the current sense error, for example due to contributions from both the current sense elements in the power stage and the current sense circuitry in the controller.

Generally, the test system 280 may interface with the controller 210 to make measurements and monitor controller telemetry while controlling the load current such that measurements can be made to accurately determine the current sense error. The test system 280 may further compute and store current sense parameters that allow current sense errors to be compensated (e.g., offset and gain error). The test system 180 may store the correction parameters in the controller 210 to achieve high current sense accuracy.

The correction parameters allow the current sense accuracy of the multiphase switched power converter to be improved beyond the accuracy of the individual current sense elements and circuitry. Implementation of the correction parameters via the test system 280 addresses challenges associated with improved accuracy of current sense in multiphase switched power converters for adaptive voltage positioning, efficiency measurement and optimization, and telemetry in the presence of component tolerance, mismatch, and temperature drift in the sense elements and circuitry.

Figure 4:
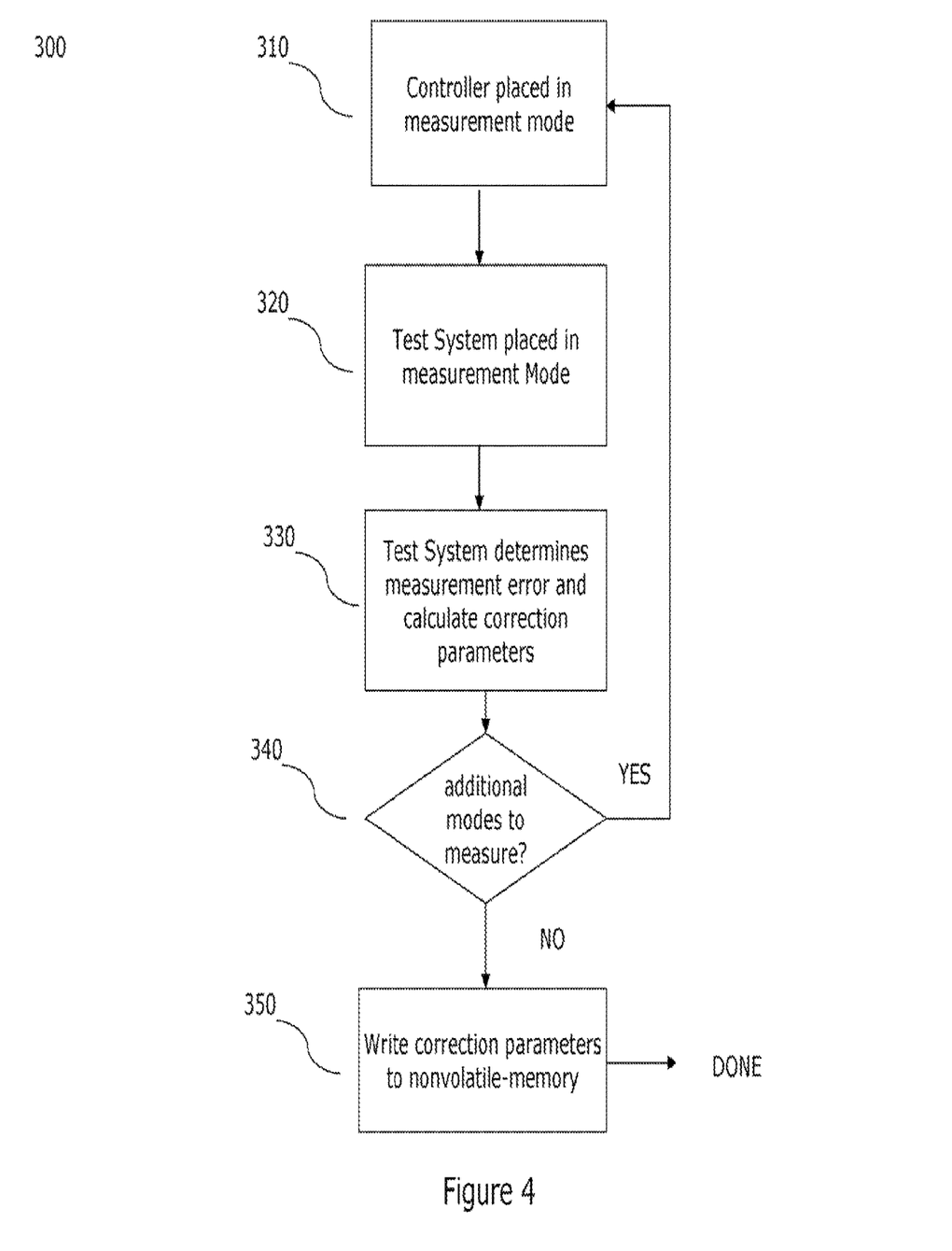
FIG. 4 is a flow diagram for an exemplary method for establishing correction parameters for the voltage regulator.

For example, referring to FIG. 4, a test procedure (300) according to various aspects of the present invention comprises placing the controller 210 in a measurement mode to facilitate measurements, such as current sense measurements (310). The controller 210 may operate in different modes, such as in response to signals from the test system 280. The measurement mode may comprise a standard operational mode or a special test mode. While in measurement mode, the test system 280 may actively control the operation mode of the controller 210, control the output voltage/current, and/or passively monitor the multiphase power regulator's 200 operational characteristics. The test system 280 may likewise be placed in a testing mode, such as a current sense measurement mode to allow for current sense accuracy measurements (230).

The test system 280 may identify errors in measurements by the regulator 200 components. For example, the test system 180 may read telemetry information from the controller 210 and compare the telemetry information with nominal data, such as measurements made by the test system 280 or known values, to determine the current sense error (330). The test system 280 may take multiple measurements in one or more operating modes, for example to determine the accuracy of the current measurements by the current sensors 261, 271 and/or the current sense circuit 230. For example, in one embodiment, the test system 280 may force a known load current through a test terminal and then read the current telemetry from the controller 210. The test system 280 may then take several measurements at various load currents and store the results of each test, such as in a memory in the test system 280.

After the test system 280 has measured the current sense error for the present mode of operation, the test system 280 may determine if there are additional modes to measure (340). For example, the different modes of operation may also include a static mode, such as a constant output current, a differential mode, such as a voltage differential, a loaded or unloaded mode, a dynamic load, such as a varying output current, a different operational mode, a special test mode, such as activating a single phase at a time, and enhanced accuracy mode. Steps 310 through 340 may then be repeated for each operating mode or other condition for measuring the performance of the regulator 200.

In one embodiment of a mode of operation, the test system 280 may force the output voltage directly and measure the load current. For example, if the load is a CPU motherboard with the CPU plugged in, the test system 280 may force an output voltage and measure the CPU current while the CPU is in a low current or off state, allowing for the determination of the CPU's leakage current. In another mode, the test system 180 may change the load current in a pre-determined dynamic manner that allows current measurements under different conditions to be made.

After each mode of operation has been tested, the test system 280 may calculate the correction parameters (330) and store the correction parameters, such as in the NVM 240 (350). The correction parameters may comprise an offset and/or gain adjustment for each mode of operation, an offset and/or gain adjustment for each power stage or phase, or a look-up table that provides non-linear correction of the current sense transfer function.

The power regulator 200 may use the correction parameters in normal operation (as opposed to a testing mode), such as when the power regulator is no longer connected to the test system 280 and is deployed to provide power to a load. When measurements or other data are received or generated, the controller 210 may access the NVM 240 and retrieve the relevant correction parameters. The controller 210 may adjust the measurements by applying the correction parameters to the measurements or other data to compensate for known errors, thus improving the accuracy of the power regulation and/or other characteristics.

For example, the output current value supplied to PWM circuit 220 in the present embodiment is the current measured by the current sensors 261, 271. The controller 210 may adjust the data from the current sensors 261, 271 according to the correction parameters retrieved from the NVM 240. This allows the current sense accuracy to be improved beyond the accuracy of the individual current sense elements and circuitry and for PWM circuit 220 to receive higher accuracy load current measurement.

Figure 5:
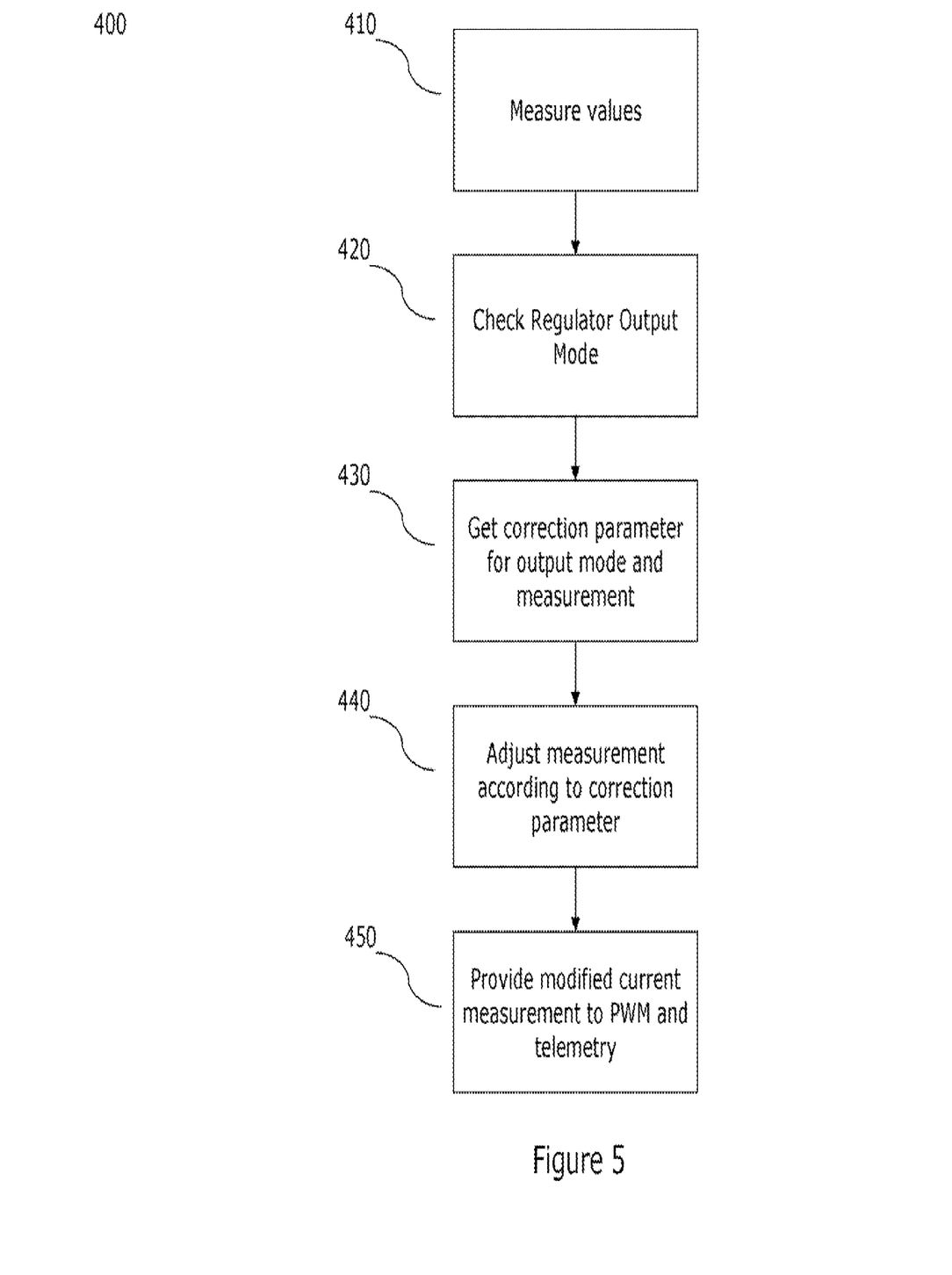
FIG. 5 is a flow diagram for an exemplary method of a voltage regulator operating with correction parameters.

Referring to FIG. 5, an operation process 400 may include adjusting the measurements according to correction parameters stored in the NVM 240. For example, the current sensors 261, 271 may measure the output current of the power stages 260, 270 (410). The controller 210 may determine the controller's 210 present output mode (420). For example, if the multiphase power regulator 200 is operating with all phases active and a steady output current, then the controller may recognize that all phases are active and the output is steady. In another case, if the multiphase power regulator 200 is operating in a low-power mode comprising only one active phase, then the controller 200 would determine it is in a low-power mode.

The controller 210 then retrieves a correction parameter for the present output mode that is stored in the NVM 240 (430). For example, if only one phase of the multiphase power regulator 200 is active, then the correction parameter for that single phase is retrieved. In another case, if the multiphase power regulator 200 is operating with a steady output current and all phases active, then one or more the corresponding correction parameters may be retrieved.

The current that is measured by the current sensors 261, 271 may be modified by the controller 110 according to the correction parameter (440). For example, if the correction parameter comprises an offset of +0.1 amps and the measured current is 3 amps, then the controller 210 may adjust the measured current to be 3.1 amps. The adjusted current measurement is then provided to the PWM circuit 220 (450). The PWM circuit 220 then provides the appropriate duty cycle to the power stages 260, 270 so as to provide the correct output voltage.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and, unless otherwise noted, are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:
1. A power regulator, comprising:
a sensor configured to generate a first measurement comprising at least one of a voltage measurement and a current measurement;

a memory configured to store a correction parameter associated with the first measurement;

a correction system configured to adjust the first measurement according to the correction parameter;

a power stage;

a controller configured to regulate an output of the power regulator according to the adjusted first measurement, wherein the controller comprises a PWM (pulse width modulation) circuit configured to provide, to the power stage, a duty cycle based upon the adjusted first measurement.

2. The power regulator of claim 1, further comprising a test interface configured to receive the correction parameter from a test system and to write the correction parameter to the memory.

3. The power regulator of claim 2, wherein the test interface is configured to allow the test system to control the output of the power regulator.

4. The power regulator of claim 2, wherein the test interface is configured to transmit the first measurement to the test system.

5. The power regulator of claim 2, wherein the controller is configured to operate in an operating mode which comprises:

a normal mode; and a test mode.

6. The power regulator of claim 5, wherein the test interface is further configured to receive an operating mode signal from the test system and place the power regulator into a corresponding operating mode.

7. The power regulator of claim 6, wherein the correction parameter comprises a first correction parameter for a first operating mode and a second correction parameter for a second operating mode.

8. The power regulator of claim 1, wherein the sensor comprises a current sensor associated with an error, and wherein the correction parameter is adapted to compensate for the error.

9. The power regulator of claim 1, further comprising a voltage sensor associated with an error, wherein the correction parameter is adapted to compensate for the error.

10. The power regulator of claim 1, wherein the correction parameter comprises a voltage sense offset.

11. The power regulator of claim 1, wherein the correction parameter comprises a current sense offset and a gain adjustment for each mode of operation.

12. The power regulator of claim 1, wherein the correction parameter comprises an offset and a gain adjustment for the power stage and an additional offset and an additional gain adjustment for an additional power stage of the power regulator.

13. The power regulator of claim 1, wherein the correction parameter comprises a look up table comprising a plurality of non-linear corrections of a current sense transfer function.

14. The power regulator of claim 1, wherein the power regulator comprises a buck converter.

15. The power regulator of claim 1, wherein the power stage of the power regulator comprises a metal-oxide semiconductor field-effect transistor (MOSFET).

16. The power regulator of claim 8, further comprising an output inductor, wherein the current sensor is a direct-current resistance (DCR) sensor that uses a voltage across the output inductor to sense a current in the output inductor.

17. The power regulator of claim 8, wherein the power stage further comprises a transistor, and the current sensor uses a voltage across a drain and a source terminal of the transistor to measure a current in the transistor.

18. The power regulator of claim 8, wherein the power stage further comprises a transistor, and the current sensor comprises a current mirror of the transistor.

19. The power regulator of claim 8, further comprising a resistor coupled to an input, the output, or a ground return of the power regulator, and the current sensor uses a voltage across the resistor to determine the first measurement.

* * * * *

UNITED STATES PATENT AND TRADEMARK OFFICE
CERTIFICATE OF CORRECTION

PATENT NO. : 10,483,847 B2
APPLICATION NO. : 14/601401
DATED : November 19, 2019
INVENTOR(S) : Tang et al.

Page 1 of 1

It is certified that error appears in the above-identified patent and that said Letters Patent is hereby corrected as shown below:

In the Claims

Column 11, Line 5 (Claim 1, Line 9) please change "power stage;" to -- power stage; and --

Signed and Sealed this
Fourth Day of February, 2020

Andrei Iancu
*Director of the United States Patent and Trademark Office*